United States Patent

Sculley

[11] Patent Number: 6,147,558
[45] Date of Patent: Nov. 14, 2000

[54] ATTENUATING VOLUME CONTROL

[75] Inventor: Terry L. Sculley, Austin, Tex.

[73] Assignee: ESS Technology, Inc., Austin, Tex.

[21] Appl. No.: 09/292,760

[22] Filed: Apr. 14, 1999

Related U.S. Application Data

[60] Provisional application No. 60/081,793, Apr. 15, 1998.

[51] Int. Cl.[7] .................................................. H03G 3/30
[52] U.S. Cl. .............................. 330/284; 330/86; 381/102
[58] Field of Search ................................. 330/86, 82, 84;
381/102, 104, 109

[56] References Cited

U.S. PATENT DOCUMENTS

| 4,354,159 | 10/1982 | Schorr et al. ............................ 330/86 |
| 4,500,845 | 2/1985 | Ehni ........................................ 330/86 |
| 5,486,791 | 1/1996 | Spitalny et al. ........................ 330/282 |
| 5,523,721 | 6/1996 | Segawa et al. . |
| 5,602,925 | 2/1997 | Killion . |
| 5,973,566 | 10/1999 | Leiby ..................................... 330/282 |

Primary Examiner—Robert Pascal
Assistant Examiner—Henry Choe
Attorney, Agent, or Firm—Fish & Richardson P.C.

[57] ABSTRACT

Two banks of differently-connected resistors are connected as an input to an op-amp feedback circuit.

12 Claims, 4 Drawing Sheets

ATTENUATING VOLUME CONTROL

CROSS REFERENCE TO RELATED APPLICATIONS

This application claims the benefit of the U.S. Provisional Application Ser. No. 60/081,793, filed on Apr. 15, 1998, which is incorporated herein by reference.

BACKGROUND

A mixer circuit with a volume control function is a typical component of audio integrated circuit chip design. An analog mixer circuit takes inputs from multiple analog audio sources, and mixes and sums those outputs. Attenuation of the analog audio source signals provides a means to control the volume output of the audio device.

A mixer circuit can use a tapped resistor string and an operational amplifier (op-amp) as shown in FIG. 1. Ideal op-amps have infinite input impedance and zero output impedance. Analog audio source signals enter as an input voltage ($V_{in}$). A tapped resistor string is coupled through a switch to the inverting input (−) of an op-amp. The non-inverting input (+) is connected to a ground reference voltage ($V_{cm}$). The circuit is a closed-loop inverting op-amp configuration in which some fraction of the output voltage ($V_o$) is fed back to the inverting input terminal.

The characteristics of an op-amp and such closed-loop configurations are well known in the art. The output signal is driven to bring the inverting input (−) terminal to the same potential as the non-inverting input (+) terminal. The inverting input terminal is maintained at a virtual ground. In addition, the high input impedance minimizes the amount of current that can flow into the op-amp. The ratio between the feedback resistance and the input resistance determines the circuit's gain. The switches can be used to change the effective resistance and hence change the gain. They therefore act as a digital volume control.

A. When such a circuit is used for audio signals, the circuit's linearity specification is important, since poor linearity produces harmonic distortion in the audio output, which causes poor audio quality. Linearity specifies the deviation of the circuit's output-versus-input relationship from a perfect, straight line response.

However, there are trade-offs associated with the circuit configuration in FIG. 1 when a large range of attenuation is desired for a volume control. In order to provide greater than approximately 70 dB attenuation (excluding the single case of infinite attenuation), the system in FIG. 1 requires either a very large resistance (Ri) from Vin to the inverting (−) terminal or a very tiny feedback resistance (Rf) from the inverting (−) terminal to Vo.

However, such large resistance takes up a relatively large amount of chip real estate, and may affect other aspects of performance. In addition, an overly tiny resistance is difficult to implement practically in conjunction with the connections that must be made from the resistance to the switches and operational amplifier terminals. The present disclosure describes an alternative which allows obtaining an expanded attenuation range while avoiding both a large input resistance value and an overly tiny feedback resistance value.

SUMMARY

According to the present system, instead of using a resistive ladder as was done in the prior art, an alternative arrangement which includes two stages of different resistive elements is used. One stage of resistive elements selectively provides a path to a bias level, called herein $V_{cm}$. In one embodiment, $V_{cm}$ can be, for example, ground. In another embodiment $V_{cm}$ could be any other bias level. The second stage includes switched resistor elements. Effectively, this system provides a combination of coarse and fine changes to gain values without a corresponding increase in the size of the substrate taken up by resistance.

BRIEF DESCRIPTION OF THE DRAWINGS

These and other aspects of the invention will now be described with reference to the attached drawings, in which.

DESCRIPTION OF THE PREFERRED EMBODIMENT

Figure 2:
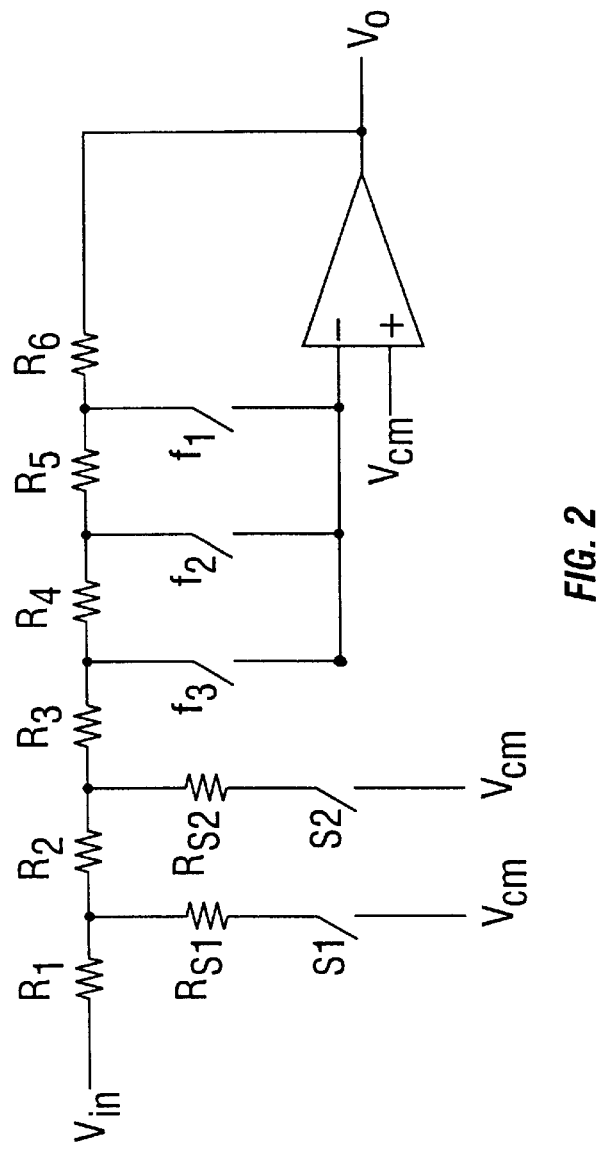
FIG. 2 shows a first embodiment of the preferred system.

A preferred embodiment is shown in FIG. 2. In general, the configuration has two different sets of input resistors to the op-amp stage: a first set of resistors selectively connected, via a switch, to a bias level referred to herein as $V_{cm}$, and a second set of resistors connected via switches to the input of the op-amp. In a preferred embodiment, the $V_{cm}$ can be ground (real ground, not the virtual ground of the op amp input) or a bias level.

FIG. 2 illustrates one embodiment of this principle. Resistors $R_{s1}$, $R_{s2}$ can be connected via switches s1, s2 to $V_{cm}$ respectively. Switches s1 and s2 are alternatively closed, thereby changing the gain on $V_{in}$.

This configuration reduces $R_i$ while still achieving a reduced gain sufficient for desired attenuation via the $A_v = -R_f/R_i$ relationship. The principal is illustrated with respect to Thevenin's theorem, which states that any linear network may, with respect to a pair of terminals, be replaced by a voltage generator $V_{oc}$ (equal to the open-circuit voltage) in series with the resistance $R_{eq}$ seen between these terminals. To find $R_{eq}$, all independent voltage sources are short-circuited and all independent current sources are open-circuited. The open-circuit voltage $V_{oc}$ is obtained by a voltage attenuator formula derived from Kirchhoff's Voltage Law.

Figure 3A:
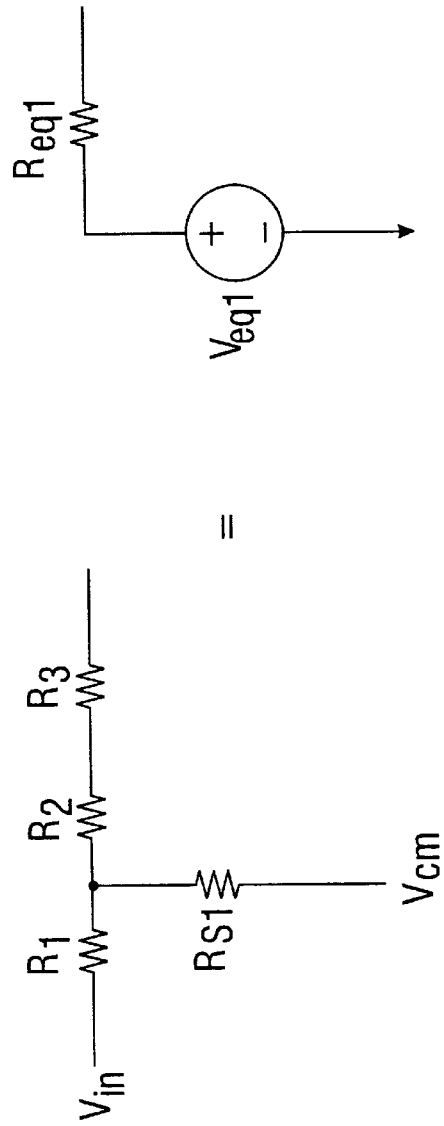
FIGS. 3A and 3B show Thevenin equivalents for the first embodiment.
Figure 3B:
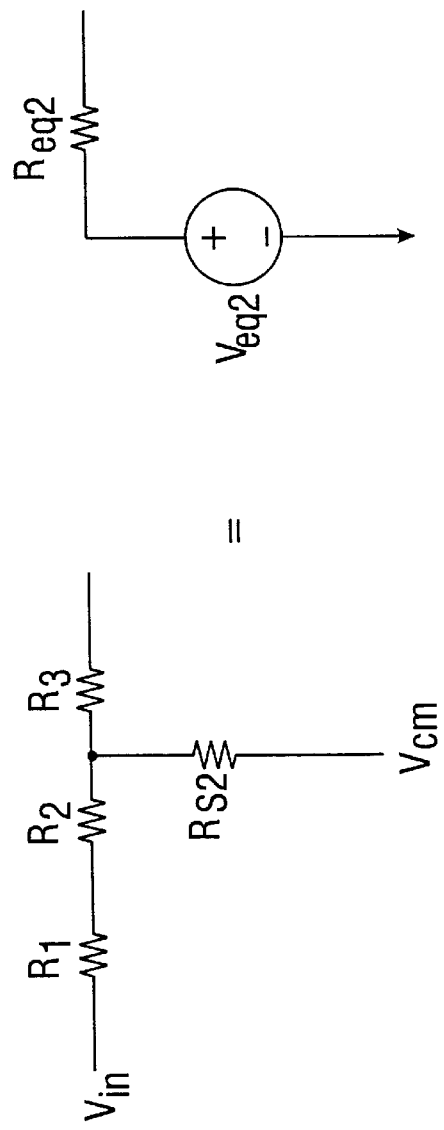

Thevenin equivalent circuits for the configuration in FIG. 2 are shown in FIG. 3A–3B. FIG. 3A shows the Thevenin equivalent when switch s1 closed, $V_{eq1}$ and $R_{eq1}$ are calculated.

Assuming the individual resistors $R_1$–$R_5$, $R_{s1}$, $R_{s2}$ are the same value, $V_{oc} = V_{in} [R_{s1}/(R_{s2}+R_1)]V_{cm}=0$ $V_{oc} = \alpha V_{in} = 0.5\ V_{in}$;

$R_{eq1} = [(R_1 R_{s1})/(R_1+R_{s1})]+R_2+R_3 = 2.5\ R$.

If we close the switch $f_1$ in the op-amp circuit, $$R = R_{eq1} + R_4 + R_5.$$

Now when we apply the voltage gain equation we find:

$$I_1 = V_{oc1}/R_i = (0.5\ V_{in})/(9/2\ R_i) = V_{in}/9Ri$$

$V_o = -I_1 R_f = -(V_{in}/9Ri)R_f$
$A_v = V_o/V_{in} = -R_f/9R_i;\ R_f = R_6$ when switch $f_1$ is closed.

Figure 1:
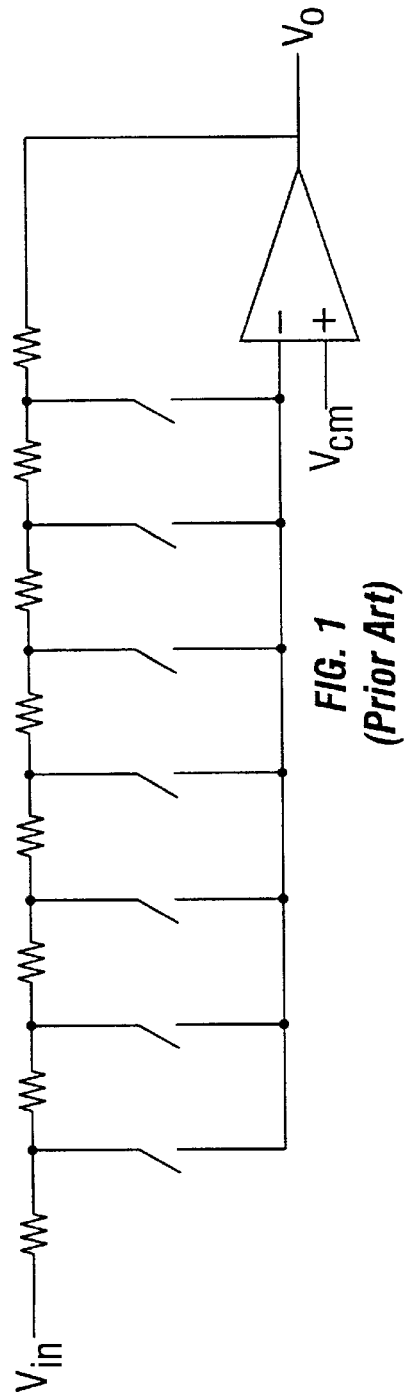
FIG. 1 shows a prior art tapped resistor string.

The resistance ($R_i$) is from $V_{in}$ to the inverting (−) terminal. In this embodiment, a $R_i$ value of 4.5 R can produce the same attenuation result as a $R_i$ value of 9R in the circuit of FIG. 1. This embodiment allows the reduction of $R_i$ while establishing the desired attenuation levels. FIG. 3B shows the Thevenin equivalent when switch s2 is closed, $V_{eq2}$ and $Req_2$ can be similarly calculated to show that a reduced $R_i$ can achieve the desired attenuation levels.

Figure 4:
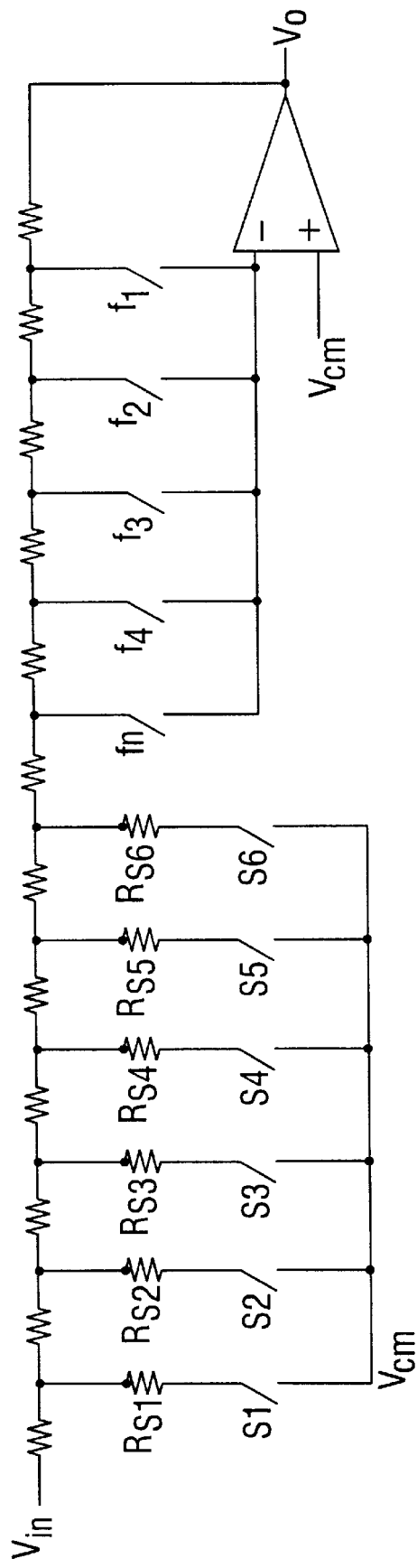
FIG. 4 shows a second embodiment in multiple cascade configuration.

Another embodiment features a multiple cascade configuration as shown in FIG. 4. A first set of gains can be obtained by closing one or more of the switches $s_1$-$s_c$. Alternatively, the other subset of switches can be closed, while opening the ones that are closed during the first set, to get a second set of gains. This configuration allows more reasonable resistor values while still allowing a large range of gains. The gains obtained by closing one switch at the op-amp inverting input (−) terminal still give us the proper dB steps.

Figure 5B:
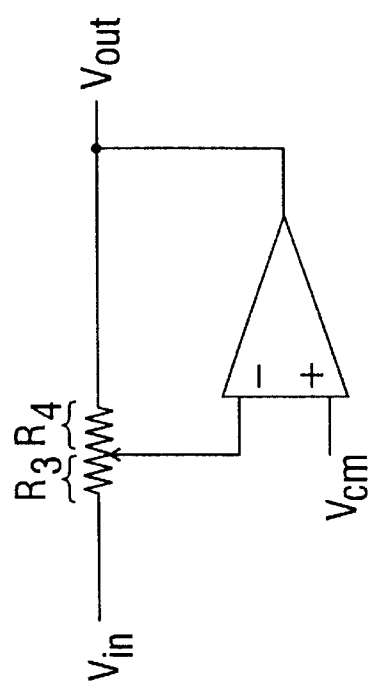
FIG. 5B shows a simplified tapped resistor.
Figure 5A:
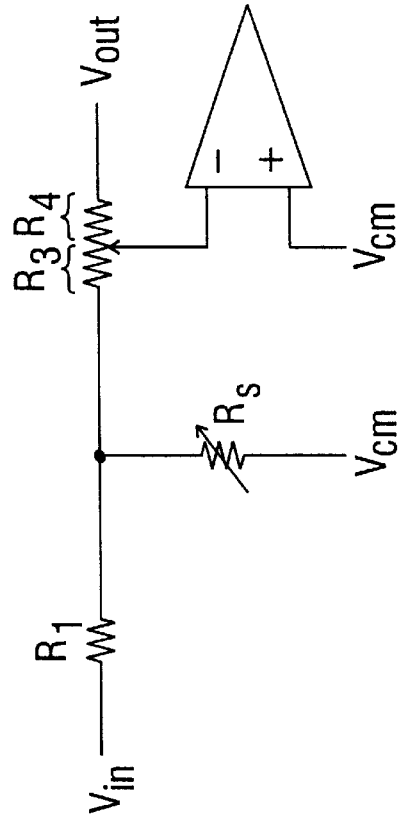
FIG. 5A shows another embodiment with a tapped resistor.
Figure 5C:
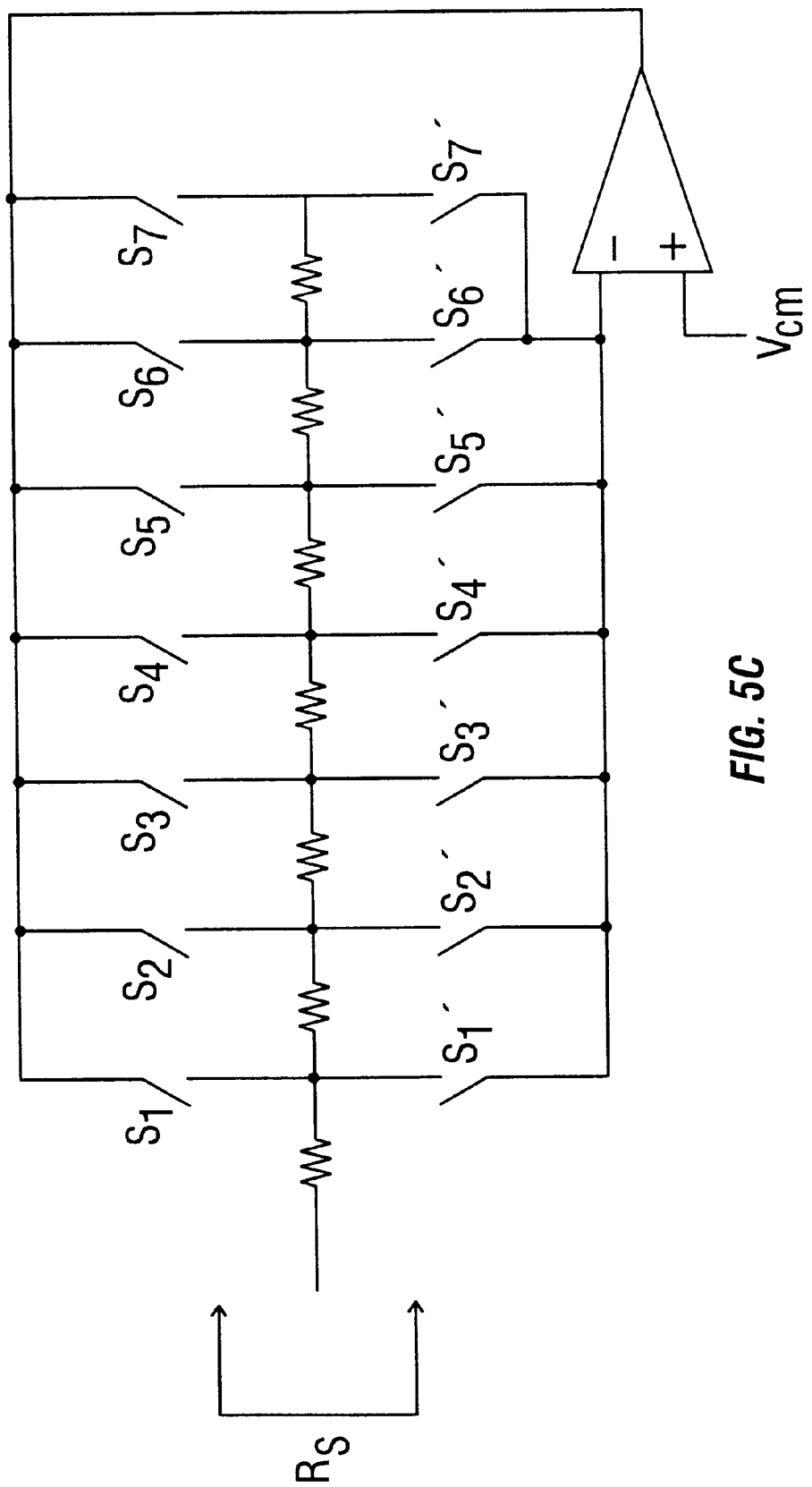
FIG. 5C shows another embodiment.

FIGS. 5A and 5C show an embodiment where the subset of tapped resistors, $R_s$, connected to $V_{cm}$ is digitally adjustable. FIG. 5A shows an op-amp configuration with $R_3$ and $R_4$ implemented as a tapped resistor string with switches connecting the chosen tap with the op-amp negative input. A set of resistors, $R_s$, is connected to $V_{cm}$. A resistor, $R_1$, is connected at the input end of the circuit.

The voltage gain of the configuration shown in FIG. 5A is represented as: $V_{out}/V_{in} = -[R_s/(R_1+R_s)][R_4/(R_3+R_1\|R_s)]$, where $R_1\|R_s = [R_1 R_s/(R_1+R_s)]$. When compared with an attenuator configuration having only the tapped resistor string as shown in FIG. 5B, the configuration in FIG. 5A can achieve comparable attenuations with more reasonable resistor values as discussed earlier. For the configuration in 5B, the voltage gain is represented as $V_{out}/V_{in} = -R_4/R_3$ as in a typical inverting amplifier configuration.

FIG. 5A shows a digitally adjustable $R_s$ configuration as shown in FIG. 5C. FIG. 5C shows a voltage follower op-amp configuration where the effective value of $R_s$ is adjusted by choosing one of the pairs of switches and closing those while opening the others.

In this particular embodiment, 7 pairs of switches with 7 resistors are used. For minimum resistance, the pair of switches, s1, s1' are closed while the other pairs of switches remain opened. For maximum resistance, the pair of switches, s7, s7' are closed while the other pairs of switches remain opened. The number of switches and resistors used can easily be varied in the circuit and is anticipated by the inventor.

Another possible setting is to leave all switches open, so the resistance of Rs is effectively infinite.

Using the configuration of FIG. 5A for $R_s$ achieves a greater range of attenuation as compared with the configuration of FIG. 5B as demonstrated by the calculations below. For example, we can choose the resistor values for the configuration of FIG. 5A as, $(R_3+R_4)=20\ K\Omega$, and that the minimum value of $R_3$ or $R_4=100\ \Omega$.

In an attenuator with only tapped resistor string as shown in FIG. 5B, the attenuation would be: $20\ \log_{10}[(20K-100)/100] \approx 46$ dB.

In contrast, the configuration in FIG. 5A can achieve a greater attenuation with a larger range by choosing resistor values for $R_1$, $R_s$, $R_3$, and $R_4$, keeping the total resistance less than or equal to 20 K$\Omega$.

Case 1:
Assume R1=9 k, Rs can be adjusted from 100 ohms to 1k or can be infinite, and R3+R4=10 k, with the minimum value of R3 or R4=100 ohms.

Case 1:
Set Rs=100 ohms, R3=9900 ohms, R4=100 ohms. Gain=−79.18 dB. This is the maximum attenuation, which is over 30dB better than that obtainable using the circuit of FIG. 5B and a total resistance of 20 k.

Case 2:
Set Rs=1 k, R3=100 ohms, R4=9900 ohms. Gain=−0.91 dB. This is the maximum gain possible without using the setting to make Rs infinite.

Case 3:
Set Rs infinite, R3=100 ohms, R4=9900 ohms. Gain=+0.73 dB. This is the maximum gain possible if we do use the setting to make Rs infinite.

In addition, the embodiment of FIG. 5A and 5C does not have a signal dependent current injected into the $V_{cm}$ node. The embodiment of FIG. 2 and FIG. 4 both feature a subset of resistors $R_{s1}$ to $R_{sc}$ connected to $V_{cm}$ via a switch, s1 to sc. These switches may allow some signal dependent current to be injected into the $V_{cm}$ node. FIG. 5C uses a voltage follow op-amp configuration as a buffer for isolation to reduce this problem.

The disclosure shows that the present invention provides an improved analog mixer circuit with more reasonable resistor values while providing a larger range of gains. This advantage is desirable for large attenuation volume control designs in audio systems.

What is claimed is:

1. An operational amplifier volume control, comprising:
    an operational amplifier device, having a first input, a second input, and an output;
    a circuit input node;
    an input resistance element, connected between said circuit input node and said first input of said operational amplifier device; and
    a feedback connection, connected between said first input of said operational amplifier device and said output of said operational amplifier device,
    said input resistance element including a plurality of resistors and a plurality of switches, including a first set of resistors selectively connected by a first set of switches to a bias level when said switches are actuated, and leaving said resistors and remaining electrically floating when said switches are not connected, and a second set of resistors and second set of switches, connected in series between said first input and said input node, each said switch leaving a resistance in series when unactuated, and removing said resistance when actuated by forming an electrical short circuit across the corresponding resistor,
    wherein said second set of switches comprises a tapped variable resistor and said second input of said operational amplifier is connected to said bias level.

2. A device as in claim 1 wherein said second set of resistors comprises a ladder of resistors with switches connected thereto, each switch in parallel with at least one switch of said ladder.

3. A device as in claim 1 wherein said second set of switches comprises a plurality of resistors, connected in series with one another, and a plurality of switches, each connected to enable any resistor to be placed in any desired series relationship with any other resistor.

4. An amplifier circuit, comprising:

an input node;

an amplifier element;

a first resistor set, connected to said input node, said first resistor set comprising a plurality of resistors, each electrically connected to said input node, and a plurality of switches, each electrically connected to each of said resistors, and when actuated, connecting each resistor to a bias voltage, said bias voltage also forming a bias for said amplifier element; and a second set of resistors, also electrically connected to said input node, and including a resistance element whose resistance can be selectively varied, a combination of resistance from said first set of resistors and said second set of resistors forming an input to said feedback circuit and another electrical element, connecting an output of said feedback circuit to an input of said feedback circuit, wherein said second set of resistors includes a tapped adjustable resistor.

5. The device as in claim 4 wherein said second set of resistors includes a plurality of resistors selectively connected by a plurality of switches.

6. An amplifier circuit, comprising:

an operational amplifier device, having an inverting first input, a non-inverting second input, and an output;

a circuit input node to receive an input signal to be amplified by said amplifier device;

an internal circuit node;

a first bias node to receive a first bias voltage;

an input resistor network having a plurality of input resistors, connected between said circuit input node and said internal circuit node;

a first switch network of one or more switches, connected between said input resistor network and said first bias node, to connect or disconnect one or more input resistors to or from said first bias node in response to a first set of digital control signals;

a second resistor network having a plurality of resistors, connected between said internal circuit node and said output of said operational amplifier device, wherein, regardless of switching states of said first switch network, each switch of said first switch network is not operable to directly connect to said internal circuit node;

a second switch network having one or more switches, connected between said second resistor network and said inverting first input, to connect or disconnect one or more resistors in said second resistor network to or from said inverting first input in response to a second set of digital control signals, wherein, regardless of switching states of said first and said second switch networks, said internal circuit node is electrically coupled to each switch in said second switch network through at least one resistor in said second resistor network and each switch of said first switch network is not operable to directly connect to said inverting first input of said operational amplifier device; and a second bias node connected to said non-inverting second input of said operational amplifier device to receive a second bias voltage.

7. The device as in claim 6 wherein said second bias voltage and said first bias voltage are substantially equal.

8. The device as in claim 6 wherein said first bias node is a circuit ground node.

9. The device as in claim 6 wherein said input resistor network comprises a ladder of input resistors; and said first switch network includes parallel switches, each switch having one terminal connected to said first bias voltage and having another terminal connected to one terminal of said ladder of resistors, such that each of said parallel switches connects to a different terminal of said ladder of resistors.

10. The device as in claim 6 wherein:

said second resistor network consists of a plurality of resistors connected in series with respect to one another;

said second switch network comprised of parallel switches, each switch having one terminal connected to said inverting first input and having another terminal connected to an internal node within said second resistor network, such that each of said parallel switches connects to a different internal node of said second resistor network.

11. The device as in claim 6, further including a digital audio circuit coupled to said output of said operational amplifier device to allow digital adjustment of an audio volume.

12. The device as in claim 6, wherein said second resistor network includes a tapped variable resistor whose tap is coupled to one of said switches in said second switch network.

* * * * *